United States Patent [19]

Kinderman et al.

[11] 4,361,635

[45] Nov. 30, 1982

[54] PHOTOLITHOGRAPHIC ELEMENT CONTAINING A SILVER-RECEPTIVE POLYALDEHYDE-CONTAINING RECEIVING LAYER

[75] Inventors: Gerard H. Kinderman, Saint Paul, Minn.; James F. Sanders, Hudson, Wis.

[73] Assignee: Minnesota Mining and Manufacturing Company, Saint Paul, Minn.

[21] Appl. No.: 275,437

[22] Filed: Jun. 19, 1981

[51] Int. Cl.³ ........................... G03C 5/54; G03C 1/48
[52] U.S. Cl. ..................................... 430/14; 430/204; 430/232
[58] Field of Search .................. 430/14, 204, 232, 247

[56] References Cited

U.S. PATENT DOCUMENTS

| | | | |
|---|---|---|---|
| 3,057,723 | 10/1962 | Jeffreys et al. | 430/243 |
| 3,690,885 | 9/1972 | Krafft et al. | 430/232 |
| 3,904,412 | 9/1975 | Serrein et al. | 430/204 |
| 4,297,430 | 10/1981 | Kanada et al. | 430/204 |

Primary Examiner—Richard L. Schilling
Attorney, Agent, or Firm—Cruzan Alexander; Donald M. Sell; Gerald F. Chernivec

[57] ABSTRACT

A photolithographic sheet capable of forming a lithographic printing plate upon imaging via silver salt diffusion transfer comprising a support, a silver halide emulsion, and a receptor layer overlying the emulsion, the receptor layer comprising a high molecular weight hydrophilic polymer and catalytic nuclei for silver salt diffusion transfer development, the major proportion of the polymer being a dialdehyde polysaccharide.

18 Claims, No Drawings

PHOTOLITHOGRAPHIC ELEMENT CONTAINING A SILVER-RECEPTIVE POLYALDEHYDE-CONTAINING RECEIVING LAYER

TECHNICAL FIELD

This invention relates to a photolithographic element suitable for preparation of a lithographic printing plate upon imaging by the silver salt diffusion transfer process. More specifically, the invention relates to a receptor layer of the photolithographic element containing therein a high molecular weight hydrophilic polyaldehyde.

BACKGROUND ART

In the silver salt diffusion process, an imagewise exposed silver halide emulsion layer is positioned in intimate contact with a receptor element and developed in the presence of a silver halide solvent such that the unexposed silver halide diffuses into the receptor element where it is developed to provide an image. Development nuclei or catalyst, contained in the receptor element, cause the diffusing silver halide to be reduced to metallic silver, thereby forming an image on the receptor element surface.

More specifically, in the silver halide diffusion transfer process a developer composition is used which contains a developing agent, e.g., hydroquinone, a solubilizing agent for silver halide, e.g., the thiosulfate ion and, preferably, an antifoggant, e.g., benzotriazole. When an imagewise exposed plate is contacted with the developer composition, the light exposed silver halide grains are reduced to silver metal in normal fashion. The unexposed grains dissolve in the developer via formation of soluble silver complexes, such as the complexes of silver thiosulfate. When the soluble silver complex contacts a development nuclei or catalyst, typically contained in a receptor layer or element, the silver is reduced to a metallic deposit. This deposit can then form the ink receptive image areas of a lithographic plate.

There are many variations on this theme, such as: some or all of the developer may be initially incorporated within the plate structure; the plate may contain either a positive or negative silver halide emulsion; the development nuclei or catalyst-containing layer may be on a separate support or receptor element and brought into intimate contact with the silver halide emulsion after being wet with developer composition, following which the two separate supports are peeled apart; a receiving layer containing development nuclei or catalyst can be contained as an intermediate layer between the initial support and the silver halide emulsion, such as is taught in U.S. Pat. No. 4,204,868; or the receptor layer can be contained on top of the silver halide emulsion layer, as is taught in U.S. Pat. Nos. 3,728,114 and 4,160,670.

While the construction having a receptor layer between the emulsion and support can provide an excellent lithographic plate, the entire emulsion layer must be removed in this case to provide functionality as a lithographic plate. The silver contained in the developing medium must then be recovered in a separate operation. Conversely, with the receptor layer overlying the emulsion, this recovery step can be eliminated.

In the case where the receptor layer overlies the emulsion, it is apparent that the receptor layer is extremely important to the functionality of the resultant structure as a lithographic plate. If the image on the plate surface is not highly ink receptive, the resultant copies during the initiation of a press run will not be fully inked, resulting in paper waste. Obviously, if the silver image is buried too deeply in the receptor layer, the plate may not in fact print at all, even if rubbed with a so-called "starter solution."

Belgian Pat. Nos. 709,193; 709,194; 716,778; and 720,695 describe a printing plate having a very thin receiving layer to increase the capability for ink acceptance by the imaged silver, and containing a very low content of a binding agent, taught to be a protective colloid. However, even with a very low content of protective colloid, it has been found to be necessary to use the aforementioned starting treatment to provide the necessary ink receptivity to image areas.

U.S. Pat. No. 3,547,641 provides for an emulsion layer having a transparent, hardened, non-removable, water permeable colloid layer containing a nucleating agent or catalyst for silver deposition by the diffusion transfer method, the layer being impregnated with a water-miscible organic solvent containing a water-soluble sulfide, such as sodium sulfide. The problem with this approach is that the soluble sulfide, during development, penetrates the individual layers as well as remaining on the surface, thereby providing only partial effect as a receiving layer; furthermore, the powerful fogging effects of sulfide on silver halide emulsions are well-known and are undesirable in this instance.

U.S. Pat. No. 3,728,114 provides for an photolithographic structure having a receiving layer which is extremely thin, taught to be less than 30 Angstroms in order to provide for appropriate silver image presentation at the plate surface. In this instance the development nuclei or catalyst are in the form of sols, i.e., heavy metals or their sulfides in sol form so as to provide a dispersion and distribution of the nuclei as individual particles. The nuclei can be applied with up to about 30 percent by weight of a high molecular weight hydrophilic compound (based on the weight of nuclei).

U.S. Pat. No. 4,160,670, taught to be an improvement over this patent, indicates that the lithographic element of this patent has disadvantages in that tolerance limits are narrow for various commercial inks, printing characteristics vary with the lapse of time before or after the making of the plate, and toning is liable to occur in long run printing.

This improvement U.S. Pat. No. 4,160,670, teaches the use of polyfunctional water soluble polymers to maintain ink receptivity of the deposited silver and improve toning during long press runs. The polymer has one structural unit containing a functional group having an affinity for development nuclei in sol form and a second structural unit capable of imparting hydrophilicity to the polymer. However, low molecular weight polymers of the type described are so water soluble little benefit is provided and high molecular weight polymers, while providing a clean plate background, can tend to cause poor rollup at the start of the press run, i.e., wherein the image areas will not optimally accept ink.

Surprisingly, we have now found that a high molecular weight hydrophilic polymeric material can be added to the receiving layer, the material having the surprising effect of not only increasing the hydrophilic properties of plate, but also improving the ink receptive properties of the silver surface image. The polymeric material found to have such utility is a polyaldehyde.

DISCLOSURE OF INVENTION

In accordance with the invention, there is provided a photolithographic sheet capable of silver salt diffusion transfer development to form a lithographic printing plate, the photolithographic sheet comprising a support having a silver halide emulsion layer and a receptor layer over the emulsion layer, the receptor layer comprising a high molecular weight hydrophilic polymer, the major proportion thereof being a polyaldehyde and catalytic nuclei for silver salt diffusion transfer development. After conventional exposure and diffusion transfer development, the receptor layer contains metallic silver image areas thereon which are ink receptive, and which allow the use of the structure as a lithographic plate.

Best Mode for Carrying Out the Invention

As indicated above, it has been found that a high molecular weight hydrophilic polymeric material can be added to the receiving layer in sufficient quantities to improve the hydrophilic properties of the resultant imaged plate, and in fact improve the ink receptive properties of the silver image. The polymeric material found to have such properties is a polyaldehyde, i.e., a polymeric compound displaying substantial aldehyde functionality. It is this aldehyde functionality that is believed to provide the novel characteristics of our photolithographic element. The polyaldehyde should comprise the major proportion of the high molecular weight polymer, i.e., greater than 50 percent by weight thereof.

An exemplary class of polyaldehydes are manufactured from polysaccharides via selective oxidation, e.g., by periodate. Exemplary polysaccharides include dextrin, dextran, celluloses, starches, etc., with the most common, and preferred, polysaccharide being a starch.

The preparation and properties of such materials is discussed in Sloan, Hofreiter, Mellies and Wolff, Ind. & Engrg. Chem. 48, p. 1165 (1956), and U.S. Pat. Nos. 2,648,629 and 2,713,553. In essence the oxidation results in products whereby a carbon-to-carbon bond is cleaved and two aldehyde groups are formed from secondary alcohol groups of anhydroglucose units of the polysaccharide. In the case of starch, the reaction is believed to be:

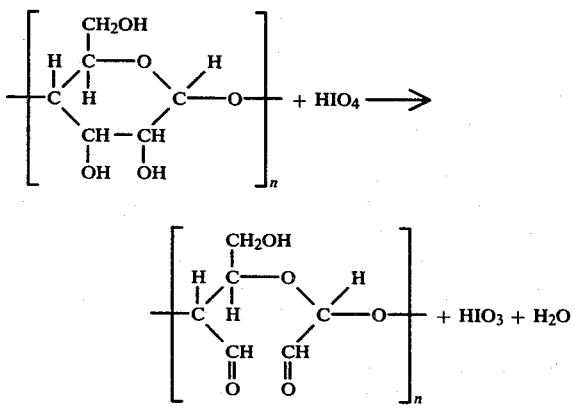

In the case of starch, the resultant product after oxidation has been termed "oxystarch" or "dialdehyde starch." Therefore, we will term the converted polysaccaride a "dialdehyde polysaccharide", an art-recognized term (see U.S. Pat. No. 4,186,024) meaning a polysaccharide in which a substantial conversion of the secondary alcohol groups to aldehyde groups has occurred. By "substantial" is meant that at least about 30 percent of the secondary alcohol groups are oxidized. It is preferred that the conversion be as high as possible, e.g. approaching 100 percent, since increased conversion correspondingly provides increased benefits in our invention.

Dialdehyde starch has been used in the prior art as a hardener for photographic gelatin. For example, in U.S. Pat. No. 3,057,723, dialdehyde starch is contained within the photographic emulsion itself to function as a hardener for the gelatin contained therein.

In addition to the noted beneficial effects obtained by including a polyaldehyde and preferably the dialdehyde polysaccharide, in the receptor layer of our structure, this component has the effect of reducing undesirable coating patterns on the receiving surface which may be the result of drying conditions in the coater ovens, a condition which is termed "mottle."

In the manufacture of the light sensitive structure of our invention, the individual layers can be simply applied in accordance with conventional techniques for application of silver halide emulsions, etc. to a substrate. For preparation of the receptor layer, conventional catalytic nuclei for silver diffusion transfer imaging and the polyaldehyde can be mixed with a suitable solvent, such as warm water, for simple coating application over the silver halide emulsion. It has been found that the benefits achieved from utilizing polyaldehyde can be detected over a wide range of coating weights, for example from about 3 to about 250 milligrams per square meter, with from about 6 to about 100 milligrams per square meter being preferred.

Conventional catalytic nuclei, such as the heavy metal sols, can be utilized in our invention. The weight ratio of polyaldehyde to nuclei in the receptor layer can vary over a broad range, from about 1.5 to 1 to about 300 to 1, and still provide the benefits described herein. It is preferred that this weight ratio be from about 20 to 1 to about 30 to 1 for optimum plate functionality on a lithographic press.

Furthermore, silver halide emulsions conventionally utilized in diffusion transfer imaging are useful in our invention, with the silver chlorobromide emulsions being preferred.

In addition, conventional underlayers, such as antihalation layers, can be utilized between the emulsion layer and the support.

The invention will now be more specifically described by the use of the following non-limiting examples, wherein all parts are by weight unless otherwise specified. In the examples, the method for measuring printing plate performance was the "split plate" technique, wherein two or more plates are mounted side by side on the press. In this manner, the variables of the press itself are minimized, such as ink condition, ink film thickness on the inking rollers, ink water content, degree of saturation of the water forme roller, ink and water ratchet settings, and the various nip pressure settings in the press.

All tests were performed on a Hamada Star 600 CD Duplicator Press, commercially available from the Hamada Printing Press Company, Ltd., Osaka, Japan.

The ink utilized in conjunction with this press was the commercially available Van Son 40904, from the Van Son Holland Ink Corporation. The water fountain solution utilized was Pro-3, commercially available from the Printers Research Company, the fountain being mixed at a volume ratio of one part to seven parts of tap water.

For a lithographic plate construction, the examples utilized a conventional 4 mil thick polyester film having a photographic subbing on one side to increase adhesion of the photographic gelatin to the polyester film. The coated layers included a conventional anti-halation layer made as follows:

A premix was made by dispersing carbon black and Silica roughening agent in a dilute gelatin solution on a ball mill so as to obtain in parts by weight:
- 0.8 part gelatin
- 12.0 parts Syloid 74 silica, commercially available from Davison Chemical Co.
- 0.4 part Regal 300 carbon black, commercially available from Cabot Corp.
- 0.04 part Daxad 11, a dispersing agent commercially available from W. R. Grace Co., and
- 86.76 parts water The final coating solution was made by mixing in parts by weight:
- 25 parts above dispersion
- 6 parts gelatin
- 1 part 10% by weight aqueous solution of Triton X-200, a wetting agent commercially available from Rohm & Haas
- 4.6 parts 5% by weight aqueous solution $H_3PO_4$
- 17.3 parts 1.6% by weight aqueous solution formaldehyde and 2% by weight aqueous solution of hydroquinone
- 46.1 parts water The gelatin was added to the water, heated at 110° F. until disolved and then cooled to 104° F. and the remainder of the components added. The composition was coated at a wet coating weight of 40.0 milligrams per square meter by extrusion coating.

A conventional chlorobromide photographic emulsion, containing 35 percent by weight silver bromide and 65 percent by weight silver chloride, was used in the examples, the silver coating weight being maintained at 0.6 grams per square meter via extrusion coating, and the ratio of gelatin to silver being 1.77 to 1.

EXAMPLE 1

A subbed polyester film was coated with the anti-halation layer and photographic emulsion as noted above. Preliminary solutions were then prepared as follows:

(1) A solution of palladium chloride (a conventional development catalyst for diffusion transfer systems) was prepared by heating a mixture of 1.0 gram of palladium chloride together with 2.0 grams of concentrated nitric acid in a total volume of 1 liter of water.

(2) A 10 percent by weight aqueous solution of Daxad 11, a dispersant commercially available from the W. R. Grace Company was prepared.

(3) A 10 percent by weight aqueous solution of Triton X-100, a wetting agent commercially available from the Rohm & Haas Company was prepared.

(4) A 7.5 percent by weight solution of dialdehyde starch, Sum Star 190, commercially available from the Hexel Chemical Company, was made in water, and the solution was buffered by the addition of 1 percent by weight sodium acetate, followed by heating at 80° C. under nitrogen for one hour to obtain a clear solution.

(5) 2.0 grams of potassium borohydride, a conventional reducing agent, was dissolved in a liter of water.

Three separate receiver layer coating solutions were then prepared as follows:

Coating solution A:
to 500 grams of water were added 100 grams of the palladium chloride solution and 2.5 grams of the Daxad 11 solution. The components were mixed at a rapid rate with an air driven stirrer following which 7.0 grams of the potassium borohydride solution were added. After one minute, 7.5 grams of the Triton solution were added and the mixer stopped. A palladium metallic sol resulted which was a clear brown-black solution.

Coating solution B:
the same solution as for coating A was prepared with the exception that 488 grams of water were used. When the sol preparation was completed, and just prior to stopping the stirrer, 12.3 grams of the dialdehyde starch solution were added.

Coating solution C:
the same procedure for solution A was followed with the exception that 450 grams of water was used, and upon completion of the sol preparation, 50 grams of the dialdehyde starch solution was added.

A precision coater was then used to coat the three receiving layer solutions on the photographic structure. In each case, the palladium metal coating weight was 1.44 milligrams per square meter. In sample A, there was no dialdehyde starch, in sample B, there were 22.5 milligrams per square meter, and in sample C there were 90.0 milligrams per square meter.

After drying, plates were manufactured by exposing the samples through a photographic positive and processing the resultant structure for 30 seconds in a diffusion transfer developer, Itek Positive Plate Developer, commercially available from the Itek Corporation. After 30 seconds exposure to this developer, the plates were rinsed in tap water and allowed to dry.

Using the aforementioned procedure for comparing the plates, plate A was compared to plates B and C. After operation of the press for about 100 impressions, each plate was wiped uniformly with a cotton swab moistened with fountain solution in order to accelerate image wear, following which the press was restarted, this procedure being designed to determine relative image durabilities.

In comparing plate A to plate B, the plate roll-up was found to be similar; plate A was found to scum more readily and rapidly than plate B when water fountain delivery was decreased; plate A exhibited more image mottle than plate B when the ink delivery rate was decreased; the durability of each plate was tested at 2,280 copies by utilizing the cotton wipe described above, and image durability was found to be equivalent between the two samples.

In comparing plate A with plate C, roll-up was found to be similar; plate C exhibited much less tendency to scum than plate A; plate A exhibited much more image mottle than plate C; and the cotton wipe test at 3,200 copies revealed that plate C had a much more durable image than plate A.

These results clearly demonstrate that the dialdehyde starch-containing receptor layers were superior to receptor layers containing no binder.

EXAMPLE 2

Example 1 was duplicated with the exception that a silver metal sol was used as a development catalyst instead of palladium metal. The silver sol was manufactured using the same procedures of Example 1, the composition of the coating solution being: 3,375 grams of water, 0.750 gram of silver nitrate, 18 grams of the Daxad 11 solution, 45 grams of the potassium borohydride solution, and 45 grams of the Triton solution.

As per Example 1, three test samples were prepared, the silver metal coating weight in the receptor layer of each being 2.1 milligrams per square meter, with the dialdehyde starch in sample D being zero, that in sample E being 90 milligrams per square meter; and that in sample F being 270 milligrams per square meter.

When comparing lithographic plates are per Example 1, plate D was compared to plates E and F. In the comparison of plate D to E, roll-up was determined to be the same; plate D had a greater tendency to scum than did plate E; plate D exhibited image mottle, whereas plate E did not; and the durability of the image area was slightly better with plate E.

When comparing plate D to plate F, plate F rolled up slower than plate D; plate D scummed more easily than plate F; plate D had image mottle, while plate F did not; and the image durability of plate F was weaker than of plate D.

The above results indicate that palladium can be replaced by silver, but that the upper level of 270 milligrams per square meter of dialdehyde starch was too great.

EXAMPLE 3

In this example, the coating weight of the palladium catalytic component was reduced to about one half that of example 1. In addition, the coating weight of the dialdehyde starch was also reduced. A suitable developer composition containing benzotriazole was compounded so as to be suitable for diffusion transfer, and to allow rapid processing of the plates in less than twenty seconds as is conventionally necessary in automatic plate processors.

The receiving layers were manufactured using the procedure of example 1, and samples G, H. and I were prepared such that each sample had a palladium metal coating weight of 0.75 milligrams per square meter, while sample G contained no dialdehyde starch, sample H contained 22.5 milligrams per square meter of dialdehyde starch, and sample I contained 45 milligrams per square meter.

Plates were again exposed and processed as per example 1 using the developer composition above. When press tested, it was observed that both plates H and I have less tendency to scum than doees plate G; both plates H and I did not exhibit image mottle, while plate G did; plate I rolled up faster than plate G, while plate H was close to plate G in roll up; and plate G was weaker than plate I in a press-run to 15,800 copies.

This example demonstrated that not only a cleaner running plate, but also a more durable plate image was produced by the inclusion of the dialdehyde starch as a binder in the receiving layer.

EXAMPLE 4

In this example, the developer composition of example 3 was modified. The benzotriazole was deleted, and another antifog agent was added; 5 grams per liter of a one percent by weight solution in methanol of 5-nitro indazole. Sufficient developer was prepared to fill the first station of an ITEK 1218 Platemaker, a commercially available machine available from the ITEK Corporation. The three plates were mounted on the press at the same time and run to 15,300 copies, whereupon results similar to that of Example 3 were obtained.

EXAMPLE 5

In this example, gelatin and gelatin/dialdehyde starch mixtures were used as binders in the receptor layer. The plates were exposed and processed as per Example 4. In both cases, the palladium content was 0.75 milligrams per square meter, and in both samples the gelatin coating weight was 1.5 milligrams per square meter. In Example J, there was no dialdehyde starch, whereas in Example K there were 22.5 milligrams per square meter thereof. Both plates were mounted on the press and run to 2500 copies, whereupon it was noted that there was less dot loss on plate K versus plate J, indicating that plate K provided a more durable image area than did plate J.

This illustrates that an improved plate can be prepared even in the presence of other binder materials.

EXAMPLE 6

Having established that receptor layers containing the dialdehyde polysaccharide out-performed those without, compositions were prepared utilizing conventional binders of the prior art. These binders were: Cyanamer P-250, a polyacrylamide of about 5,000,000 molecular weight, commercially available from the American Cyanamide Company; Cyanamer P-35, a polyacrylamide having a molecular weight of 7,500 (and thus highly soluble in water), commercially available from the American Cyanamide Company; and Polyox WSR-301, a polyethylene glycol of about 6,000,000 molecular weight, commercially available from the Union Carbide Company.

Receptor layer constructions were then prepared as per example 1 with each sample containing 0.75 milligram per square meter of palladium metal, and with sample L containing six milligrams per square meter of P-250; sample M containing six milligrams per square meter of P-35; sample N containing six milligrams per square meter of WSR-301; and sample O containing six milligrams per square meter of dialdehyde starch.

The plates were exposed and processed as per example 4, whereupon plates L, M and N were compared with plate O. The plates were all run to 100 copies to determine roll up, and then rubbed to determine image durability. Plate L rolled up very slowly compared to O; copy 4 was good from the plate O, while copy 20 was of minimally acceptable quality from plate L and plate L was much weaker than plate O. Plate M rolled up about the same as plate O, and it appeared to have no difference in durability when compared thereto. Plate N rolled up very slowly compared to plate O and plate N was much weaker in image durability than plate O.

This example illustrates that the dialdehyde starch, which is substantially insoluble in cold aqueous media can provide improved printing properties. The high molecular weight conventional polymers provide a hydrophilic surface, but can cause blinding, while the low molecular weight polymers of the prior art have very little effect on plate rollup and press life.

In a separate test, the P-35 and dialdehyde starch were applied at coating weights of 24 milligrams per square meter, and the P-35 exhibited similar scumming tendencies to a plate containing no binder, while the dialdehyde starch-containing plate had substantially less tendency to scum.

EXAMPLE 7

In this example, corn starch and gelatin were compared to the dialdehyde starch. The corn starch utilized was Penford Gum 250, commercially available from Penick and Ford, Limited. The corn starch was dissolved at 95° C. under nitrogen to form a colorless solution with a slight haze at two percent by weight solids. As per example 1, receiving layers were prepared such that all samples contained 0.75 milligrams per square meter of palladium metal, sample P contained no binder; sample Q contained 24 milligrams per square meter of Penford Gum 250; sample R contained 24 milligrams per square meter of gelatin; and sample S contained 24 milligrams per square meter of dialdehyde starch.

Following plate preparation and processing as per example 4, the plates were compared for roll up and durability to one hundred copies as per example 6. Results indicated that plate S rolled up slightly faster than plate P; plate Q rolled up much slower than plate P, and in fact did not produce acceptable copies by copy 100; plate R rolled up much slower than plate P, and again did not produce acceptable copies by copy 100.

This example illustrates that starch which has not been substantially converted to the dialdehyde does not function, and is as unsatisfactory as gelatin, a protective colloid.

EXAMPLE 8

In this example, palladium sulfide was used as the development catalyst in the receptor layer; a palladium sulfide sol was made by adding to 875 grams of water 4 grams of 10 percent by weight Daxad 11, 80 grams of palladium chloride, and 15 grams of Triton X-100 solution, following which were added, with rapid stirring, 10.84 grams of a 10 gram per liter solution of hydrated sodium sulfide.

In the samples, the palladium sulfide coating weight was maintained at 1.0 milligram per square meter, and in sample T, there was no dialdehyde starch present, while sample U contained three milligrams per sqare meter of dialdehyde starch. When the plates were exposed and processed as per example 4, plate U rolled up more rapidly than plate T.

This example demonstrates that heavy metal sulfide-containing receiving layers also benefit from the inclusion of dialdehyde starch at a very low coating weight.

EXAMPLE 9

In this example, the dialdehyde starch of example 1 was modified with urea, the reaction being carried out at 80° C. for two hours under nitrogen at a pH of 7.6 using a two percent by weight concentration of dialdehyde starch and 0.17 percent by weight concentration of urea. After cooling the reaction mixture, the mixture was adjusted to 5.7 pH with 1 N nitric acid to prevent oxidation. The resulting solution had a deep straw colored appearance and a slight haze. Plates were then prepared, exposed, and processed as per example 6, keeping the palladium metal coating weight at 0.75 milligrams per square meter, with sample V containing no dialdehyde starch and sample W containing 6.0 milligrams per square meter of the urea-modified dialdehyde starch.

When these plates were compared on the press, it was observed that plate W rolled up faster than plate V, it being estimated that good copies were produced 10 copies sooner with plate W than with plate V.

This example demonstrates that the dialdehyde starch can be chemically modified and still provide benefit in the receiving layer.

What is claimed is:

1. A photolithographic light-sensitive sheet capable of providing a lithographic plate after imaging by diffusion transfer comprising a support, a silver halide emulsion layer overlying said support, and a receptor layer overlying said emulsion, said receptor layer comprising at least one high molecular weight hydrophilic polymer and catalytic nuclei for silver salt diffusion transfer development, the major proportion of said polymer being a dialdehyde polysaccharide.

2. The photolithographic sheet of claim 1 having an antihalation layer interposed between said silver halide emulsion layer and said support.

3. The photolithographic sheet of claim 1 wherein said dialdehyde polysaccharide is present in said receptor layer at a coating weight of from about 3 to about 250 milligrams per square meter.

4. The photolithographic sheet of claim 3 wherein said coating weight of said dialdehyde polysaccharide is from about 6 to about 100 milligrams per square meter.

5. The photolithographic sheet of claim 1 wherein said dialdehyde polysaccharide is dialdehyde starch.

6. The photolithographic sheet of claim 1 wherein said dialdehyde polysaccharide is present at a weight ratio of said catalytic nuclei of from about 1.5 to 1 to about 300 to 1.

7. The photolithographic sheet of claim 6 wherein said weight ratio is from about 20 to 1 to about 30 to 1.

8. The photolithographic sheet of claim 1 wherein said silver halide emulsion is a silver chlorobromide emulsion.

9. A lithographic plate comprising a support, a silver halide emulsion layer over said support, and a receptor layer over said emulsion layer having ink receptive image areas on the surface thereof, said receptor layer comprising a high molecular weight hydrophilic polymer and catalytic nuclei for silver salt diffusion transfer development, the major proportion of said polymer being a dialdehyde polysaccharide, and said image areas comprising silver metal produced by silver salt diffusion transfer development in said receptor layer.

10. The lithographic plate of claim 9 having an antihalation layer interposed between said support and said emulsion layer.

11. The lithographic plate of claim 9 wherein said dialdehyde polysaccharide has a coating weight in said receptor layer of from about 3 to about 250 milligrams per square meter.

12. The lithographic plate of claim 11 wherein said coating weight is from about 6 to about 100 milligrams per square meter.

13. The lithographic plate of claim 9 wherein said dialdehyde polysaccharide is dialdehyde starch.

14. The lithographic plate of claim 9 wherein said dialdehyde polysaccharide is present at a weight ratio to said catalytic nuclei of from about 1.5 to 1 to about 300 to 1.

15. The lithographic plate of claim 14 wherein said weight ratio is from about 20 to 1 to about 30 to 1.

16. The lithographic plate of claim 9 wherein said silver halide emulsion is a silver chlorobromide emulsion.

17. A process for forming a lithographic plate comprising the steps of:
(1) exposing a photolithographic element comprising a support having a silver halide emulsion thereon to actinic radiation;
(2) developing said silver halide emulsion by silver salt diffusion transfer in the presence of a diffusion transfer receptor layer, said receptor layer comprising a high molecular weight hydrophilic polymer and catalytic nuclei for silver salt diffusion transfer development, the major proportion of said polymer being a dialdehyde polysaccharide.

18. The process of claim 17 wherein said receptor layer and said emulsion layer are both contained in an integral structure and said receptor layer overlies said emulsion layer.

* * * * *